US010027365B2

(12) United States Patent
Yun (10) Patent No.: US 10,027,365 B2
(45) Date of Patent: Jul. 17, 2018

(54) RADIO FREQUENCY (RF) TRANSCEIVER AND OPERATING METHOD THEREOF (71) Applicant: Samsung Electronics Co., Ltd., Suwon-si (KR)

(72) Inventor: Seok Ju Yun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/474,758

(22) Filed: Mar. 30, 2017

(65) Prior Publication Data
US 2018/0019782 A1 Jan. 18, 2018

(30) Foreign Application Priority Data

Jul. 18, 2016 (KR) .................. 10-2016-0090861

(51) Int. Cl.
H04B 1/40 (2015.01)
H03B 5/12 (2006.01)
(Continued)

(52) U.S. Cl.
CPC .......... H04B 1/406 (2013.01); H03B 5/1234 (2013.01); H03B 5/1237 (2013.01); H03B 5/24 (2013.01);
(Continued)

(58) Field of Classification Search
CPC .. H04B 1/406; H04B 1/40; H03F 3/19; H03F 1/565; H03F 3/245; H03F 2200/387;
(Continued)

(56) References Cited

U.S. PATENT DOCUMENTS 5,890,051 A * 3/1999 Schlang ................. H03D 7/163
455/315
6,633,752 B1 * 10/2003 Hashigaya .......... H04L 27/1563
375/317
(Continued)

FOREIGN PATENT DOCUMENTS

JP 2004-7433 A 1/2004
JP 2004-538709 A 12/2004
(Continued)

OTHER PUBLICATIONS

Jose L. Bohorquez, et al., "A 350 µW CMOS MSK Transmitter and 400 µW OOK Super-Regenerative receiver for Medical Implant Communications," IEEE Journal of Solid-State Circuits, vol. 44, No. 4, Apr. 2009, pp. 1248-1259.
(Continued)

Primary Examiner — Andrew Wendell
(74) Attorney, Agent, or Firm — NSIP Law (57) ABSTRACT A radio frequency (RF) transceiver includes a first oscillator configured to generate a first oscillation frequency associated with an RF signal, a second oscillator configured to generate a second oscillation frequency associated with a clock frequency, a counter configured to generate a counter output signal using the first oscillation frequency and the second oscillation frequency, and a comparer configured to generate a digital output signal associated with the RF signal by comparing an output value of the counter output signal to a reference value.

18 Claims, 9 Drawing Sheets (51) Int. Cl.
*H04B 1/403* (2015.01)
*H03B 5/32* (2006.01)
*H03G 3/30* (2006.01)
*H03B 5/24* (2006.01)
*H03F 3/19* (2006.01)
*H03F 3/24* (2006.01)
*H03F 1/56* (2006.01)

(52) U.S. Cl.
CPC ............... *H03B 5/32* (2013.01); *H03F 1/565* (2013.01); *H03F 3/19* (2013.01); *H03F 3/245* (2013.01); *H03G 3/3042* (2013.01); *H03F 2200/222* (2013.01); *H03F 2200/294* (2013.01); *H03F 2200/387* (2013.01); *H03F 2200/451* (2013.01)

(58) Field of Classification Search
CPC ......... H03F 2200/451; H03F 2200/222; H03F 2200/294; H03B 5/1237; H03B 5/1234; H03B 5/32; H03B 5/24; H03G 3/3042
See application file for complete search history.

(56) References Cited

U.S. PATENT DOCUMENTS

| | | | |
|---|---|---|---|
| 6,662,107 B2* | 12/2003 | Gronemeyer | G01S 19/23 |
| | | | 342/357.63 |
| 6,781,424 B2 | 8/2004 | Lee et al. | |
| 7,020,226 B1* | 3/2006 | Kirkland | H04L 5/0048 |
| | | | 370/203 |
| 7,565,129 B2 | 7/2009 | Kim et al. | |
| 8,346,180 B2 | 1/2013 | Kamizuma et al. | |
| 2013/0082784 A1* | 4/2013 | Chiu | H03L 7/091 |
| | | | 331/44 |
| 2013/0107988 A1* | 5/2013 | Park | H04B 1/24 |
| | | | 375/316 |
| 2014/0218082 A1* | 8/2014 | Fan | H03H 19/004 |
| | | | 327/157 |
| 2014/0262970 A1* | 9/2014 | Sato | B03C 5/005 |
| | | | 209/127.1 |
| 2015/0077189 A1* | 3/2015 | Yorita | H03L 1/02 |
| | | | 331/18 |
| 2015/0288396 A1 | 10/2015 | Yun et al. | |
| 2015/0381219 A1* | 12/2015 | Kramer | H04B 1/0475 |
| | | | 375/297 |
| 2016/0248414 A1* | 8/2016 | Vilangudipitchai | |
| | | | H03K 17/04206 |
| 2016/0308491 A1* | 10/2016 | Elgaard | H03B 5/06 |
| 2017/0030761 A1* | 2/2017 | Lin | G01F 23/284 |
| 2017/0155394 A1* | 6/2017 | Calhoun | H03L 1/026 |

FOREIGN PATENT DOCUMENTS

| | | |
|---|---|---|
| JP | 2007-228274 A | 9/2007 |
| JP | 2013-126074 A | 6/2013 |
| KR | 10-0550318 B1 | 2/2006 |
| KR | 10-0579680 B1 | 5/2006 |
| KR | 10-0729976 B1 | 6/2007 |
| KR | 10-1190051 B1 | 10/2012 |
| KR | 10-1373532 B1 | 3/2014 |

OTHER PUBLICATIONS

Alan Wong, et al., "A 1V 5mA Multimode IEEE 802.15.6/Bluetooth Low-Energy WBAN Transceiver for Biotelemetry Applications," *Proceedings of the 2010 IEEE International Solid-State Circuits Conference*, Diagnositc & Therapeutic Technologies for Health, ISSCC 2012, Session 17, Feb. 2012, pp. 300-302.

Yao-Hong Liu, et al., "A 1.9nJ/b 2.4GHz Multistandard (Bluetooth Low Energy/Zigbee/IEEE802.15.6) Transceiver for Personal/Body-Area Networks," *Proceedings of the 2013 IEEE International Solid-State Circuits Conference*, Energy-Effiecient Wireless, ISSCC 2013, Session 25, Feb. 2013, pp. 446-448.

* cited by examiner

RADIO FREQUENCY (RF) TRANSCEIVER AND OPERATING METHOD THEREOF

CROSS-REFERENCE TO RELATED APPLICATIONS

This application claims the benefit under 35 USC § 119(a) of Korean Patent Application No. 10-2016-0090861 filed on Jul. 18, 2016, in the Korean Intellectual Property Office, the entire disclosure of which is incorporated herein by reference for all purposes.

BACKGROUND

1. Field

The following description relates to a radio frequency (RF) transceiver and an operating method of an RF transceiver. More particularly, the following description relates to an RF transceiver configured to minimize a number of external components, and configured to be insensitive to a noise, a process, and a temperature.

2. Description of Related Art

A typical radio frequency (RF) transceiver includes an input end of a receiver and an output end of a transmitter which are separate from one another, and includes a switch for making a connection with an antenna. Thus, the typical RF transceiver basically uses a great number of external components, such as a matching component for the output end of the transmitter, a matching component for a transmitting end of the input end of the receiver, a matching component for the antenna, and the switch.

It may be desirable to decrease the number of external components for an RF transceiver in case in which the RF transceiver should be miniaturized, such as, for example, when the RF transceiver is for Internet of Things (IoT) devices, human body implementable medical devices, and miniature sensors. An external component used in an RF transceiver integrated circuit (IC) includes an antenna, a capacitor that stabilizes a power, and a crystal (X-Tal) of an X-Tal oscillator that generates a reference frequency. The X-Tal is used for generating the reference frequency because it is insensitive to a process and a temperature change. However, the X-Tal is necessarily an external component because it may not be included in a chip. External components such as the X-Tal may make it necessary to increase the size of a module. That is, it may be difficult to miniaturize the RF transceiver when the RF transceiver uses the external components.

When a reference frequency generator is included in a chip, a receiving sensitivity level is changed due to a noise change and a temperature change, thereby reducing safety in general. Thus, there is need for an RF transceiver that is insensitive to a process, a noise, and a temperature change, that uses fewer external components, and that may include modules of a smaller size.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency (RF) transceiver includes: a first oscillator configured to generate a first oscillation frequency associated with an RF signal; a second oscillator configured to generate a second oscillation frequency associated with a clock frequency; a counter configured to generate a counter output signal using the first oscillation frequency and the second oscillation frequency; and a comparer configured to generate a digital output signal associated with the RF signal by comparing an output value of the counter output signal to a reference value.

The counter output signal may be associated with a ratio of the first oscillation frequency to the second oscillation frequency.

The first oscillator may include: an antenna configured to receive the RF signal; a negative R-generator electrically connected to the antenna; and a capacitor bank connected in parallel with the antenna and the negative R-generator.

The RF transceiver may further include: a quenching wave generator configured to generate a quenching signal that controls a negative R-generator of the first oscillator using the second oscillation frequency.

The RF transceiver may further include: an auto gain calibration controller configured to disable the quenching wave generator and the negative R-generator in response to an input power of the RF signal being greater than or equal to a threshold value.

The RF transceiver may further include: an alternating current (AC) coupling capacitor disposed between the first oscillator and the counter.

The RF transceiver may further include: a data generator configured to generate transmission data; and a modulator configured to modulate the transmission data received from the data generator using the first oscillator.

The RF transceiver may further include: an auto amplitude calibration controller connected to the first oscillator and configured to correct an amplitude of the first oscillator.

The RF transceiver may further include: an auto frequency calibration controller electrically connected to the first oscillator and configured to correct a frequency of the first oscillator.

The first oscillator and the second oscillator m disposed in a single RF transceiver integrated circuit (IC).

In another general aspect, a radio frequency (RF) transceiver includes: a first oscillator configured to generate a first oscillation frequency associated with an RF signal; a second oscillator configured to generate a second oscillation frequency associated with a clock frequency; an envelope detector configured to detect an envelope signal from the first oscillation frequency; a counter configured to generate a counter output signal using the first oscillation frequency, the second oscillation frequency, and the envelope signal; and a comparer configured to generate a digital output signal associated with the RF signal by comparing the counter output signal to a reference value.

The counter output signal may be associated with a ratio of the first oscillation frequency to the second oscillation frequency.

The envelope signal may be applied to an enable signal of the counter.

The first oscillator may include: an antenna configured to receive the RF signal; a negative R-generator electrically connected to the antenna; and a capacitor bank connected in parallel with the antenna and the negative R-generator.

The RF transceiver may further include: a quenching wave generator configured to generate a quenching signal that controls a negative R-generator of the first oscillator using the second oscillation frequency.

The RF transceiver may further include: an auto gain calibration controller configured to disable the quenching wave generator and the negative R-generator in response to an input power of the RF signal being greater than or equal to a threshold value.

The RF transceiver may further include: an alternating current (AC) coupling capacitor disposed between the first oscillator and the counter.

In another general aspect, a radio frequency (RF) transceiver includes: a first oscillator configured to generate a first oscillation frequency associated with an RF signal; a second oscillator configured to generate a second oscillation frequency associated with a clock frequency; a quenching wave generator configured to generate a quenching signal that controls the first oscillator using the second oscillation frequency; and an auto gain calibration controller configured to enable or disable the quenching wave generator based on an input power of the RF signal.

The auto gain calibration controller may be further configured to enable the quenching wave generator in response to a receiving sensitivity level being relatively high.

The RF transceiver may further include: a counter configured to generate a counter output signal using the first oscillation frequency and the second oscillation frequency; and a comparer configured to generate a digital output signal associated with the RF signal by comparing an output value of the counter output signal to a reference value.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

When describing examples with reference to the accompanying drawings, like reference numerals refer to like constituent elements and a repeated description related thereto will be omitted. When it is determined detailed description related to a related configuration they may make the purpose of the examples unnecessarily ambiguous in describing the examples, the detailed description will be omitted here.

Figure 1:
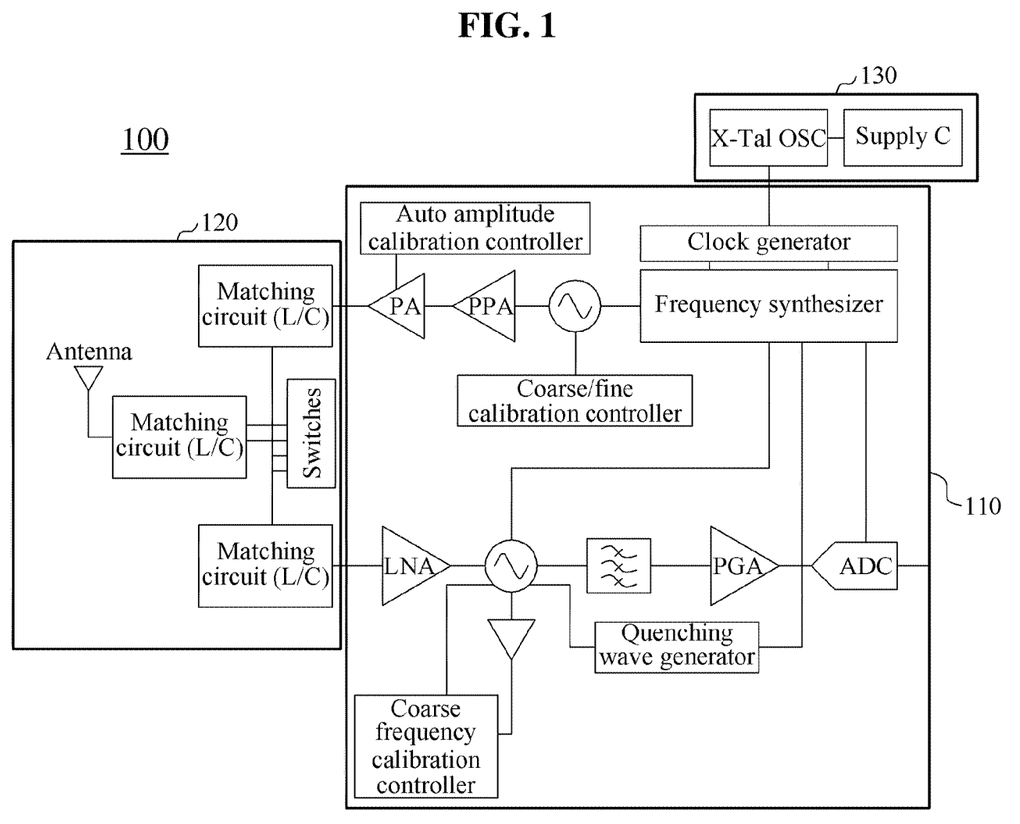
FIG. 1 is a block diagram illustrating a portion of a radio frequency (RF) transceiver, according to an embodiment.

FIG. 1 is a block diagram illustrating a portion of a radio frequency (RF) transceiver 100, according to an embodiment. The RF transceiver 100 includes an integrated circuit (IC) chip 110, a first external component 120, and a second external component 130.

As illustrated in FIG. 1, an input end of a receiver and an output end of a transmitter are included separately in the IC chip 110. Thus, it may be desirable that the first external component 120 includes a matching component (matching circuit (L/C) for the output end of the transmitter and a matching component (matching circuit (L/C) for a transmitting end of the input end of the receiver separately. In addition, the first external component 120 includes a matching component (matching circuit (L/C) for an antenna and one or more switches. The second external component 130 includes a crystal (X-Tal) oscillator for generating a reference frequency and a supply capacitor for stabilizing a power.

The use of the first external component 120 and the second external component 130 may cause an increase in a size of an RF transceiver module 100 because the use of the first external component 120 and the second external component 130 may necessitate the use of a great number of matching components and a large volume X-Tal oscillator.

Thus, a structure capable of receiving an RF signal using an oscillator which may be included in a chip in lieu of using a matching component and an external oscillator is disclosed below. For example, a structure of an RF transceiver, according to an embodiment, includes an LC oscillator configured to receive an RF input signal through an antenna, an RC oscillator configured to generate an internal frequency, a counter configured to sense the RF input signal by comparing a frequency of the LC oscillator to a frequency of the RC oscillator, and a comparer configured to generate a digital output signal by comparing an output value of the counter to a reference value.

The structure of the RF transceiver disclosed below is used to transmit and receive through an RF port by combining the antenna, the matching component for the transmitter, and the matching component for the receiver. The antenna is used as an inductor of the LC oscillator in the chip, and the antenna is directly used to modulate a transmitting signal using the LC oscillator when transmitting is performed.

The structure of the RF transceiver disclosed below has relatively low complexity, such that an amount of power consumption may be relatively small and the RF transceiver may be miniaturized. The structure of the RF transceiver is insensitive to a noise change and a temperature change because a time to digital converter (TDC) method of calculating an output value by comparing the frequency of the LC oscillator to the frequency of the RC oscillator (or a ring oscillator) is implemented in the IC chip.

Figure 2:
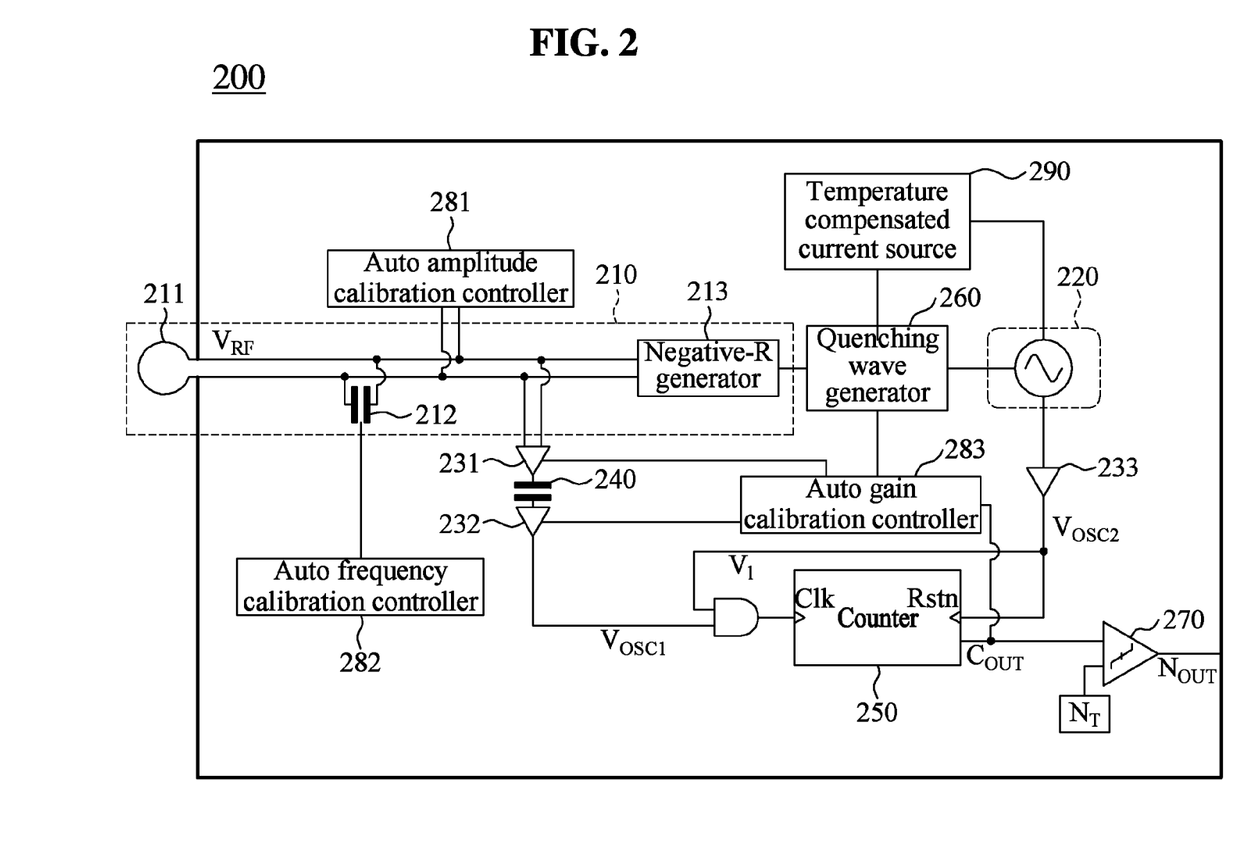
FIG. 2 is a block diagram illustrating a portion of a radio frequency (RF) transceiver, according to another embodiment.

FIG. 2 is a block diagram illustrating a portion of a radio frequency (RF) transceiver 200, according to another an embodiment. The RF transceiver 200 includes a first oscillator 210, a second oscillator 220, a counter 250, and a comparer 270. The RF transceiver 200 further includes amplifiers 231, 232, and 233, an alternating current (AC) coupling capacitor 240, a quenching wave generator 260, an auto amplitude calibration controller 281, an auto frequency calibration controller 282, an auto gain calibration controller 283, and a temperature compensated current source 290.

The first oscillator 210 generates a first oscillation frequency $f_{osc1}$ associated with an RF signal $V_{RF}$ received from an antenna 211 using a coil of the antenna 211 as an inductor of an LC-tank. For example, the first oscillator 210 is an LC oscillator disposed in an RF transceiver integrated circuit (IC). For example, the first oscillator 210 includes the antenna 211, a capacitor bank (C-bank) 212, and a negative-R generator 213. The antenna 211 is, for example, a loop antenna. The C-bank 212 is connected in parallel with the antenna 211 and the negative-R generator 213. An output signal $V_{osc1}$ of the first oscillator 210 associated with the first oscillation frequency $f_{osc1}$ is input to a clock Clk of the counter 250 via the amplifiers 231 and 232, and the AC coupling capacitor 240.

The second oscillator 220 generates a second oscillation frequency $f_{osc2}$ corresponding to an internal clock frequency. For example, the second oscillator 220 is an RC oscillator or a ring oscillator disposed in the RF transceiver IC. An output signal $V_{osc2}$ of the second oscillator 220 associated with the second oscillation frequency $f_{osc2}$ is used as a reset signal Rstn of the counter 250. For example, the counter 250 is reset on a rising edge of the output signal $V_{osc2}$ of the second oscillator 220.

The output signal $V_{osc2}$ of the second oscillator 220 is also used as a quenching signal that controls the first oscillator 210. For example, the quenching wave generator 260 generates a quenching signal that controls a current source of the first oscillator 210 using the output signal $V_{osc2}$ of the second oscillator 220. The quenching signal uses the second oscillation frequency $f_{osc2}$, but also controls the current source by changing a form and a duty cycle of a signal in the quenching wave generator 260. Thus, a current waveform having various forms may be applied to the LC oscillator.

In an example, the negative-R generator 213 is selectively enabled or disabled based on an input power of the RF signal $V_{RF}$. In response to the negative-R generator 213 being disabled, the quenching wave generator 260 is controlled such that a current is not supplied to the negative-R generator 213. For example, in response to the input power of the RF signal $V_{RF}$ being greater than or equal to a predetermined threshold value, the auto gain calibration controller 283 disables the negative-R generator 213 and the quenching wave generator 260 and thus, the received RF signal $V_{RF}$ is amplified only by the amplifiers 231 and 232, and the AC coupling capacitor 240. Conversely, in response to the input power of the RF signal $V_{RF}$ being less than the predetermined threshold value, the auto gain calibration controller 283 enables the negative-R generator 213 and the quenching wave generator 260 and thus, the received RF signal $V_{RF}$ is received through oscillation of the first oscillator 210.

In an example, the auto gain calibration controller 283 selectively enables and disables the negative-R generator 213 and the quenching wave generator 260 in response to a receiving sensitivity level to be requested. For example, when a relatively high receiving sensitivity level is requested, the auto gain calibration controller 283 enables the negative-R generator 213 and the quenching wave generator 260. Conversely, when the relatively high receiving sensitivity level is not requested, the auto gain calibration controller 283 disables the negative-R generator 213 and the quenching wave generator 260.

The counter 250 generates a counter output signal $C_{OUT}$ based on a time-to-digital converter (TDC) method using the first oscillation frequency $f_{osc1}$ and the second oscillation frequency $f_{osc2}$. The counter output signal $C_{OUT}$ is associated with a ratio of the first oscillation frequency $f_{osc1}$ to the second oscillation frequency $f_{osc2}$. In response to a difference between the first oscillation frequency $f_{osc1}$ and the second oscillation frequency $f_{osc2}$ being relatively great, a difference between a number of clocks to be counted by the counter 250 when the RF signal $V_{RF}$ corresponds to 1 and the number of clocks to be counted by the counter 250 when the RF signal $V_{RF}$ corresponds to 0 may increase.

For example, when the RF signal $V_{RF}$ corresponds to 1, the oscillation of the first oscillator 210 may be relatively fast such that the number of the clocks to be counted by the counter 250 may be a relatively great value. Accordingly, the counter output signal $C_{OUT}$ may have a relatively great value. Conversely, when the RF signal $V_{RF}$ corresponds to 0, the oscillation of the first oscillator 210 may be relatively slow such that the number of clocks to be counted by the counter 250 may be a relatively small value. Accordingly, the counter output signal $C_{OUT}$ may have a relatively small value.

The comparer 270 generates a digital output signal $N_{OUT}$ associated with the RF signal $V_{RF}$ by comparing an output value of the counter output signal $C_{OUT}$ to a reference value $N_T$. In response to the output value of the counter output signal $C_{OUT}$ being greater than or equal to the reference value $N_T$, the digital output signal $N_{OUT}$ has a value of 1. In response to the output value of the counter output signal $C_{OUT}$ being less than the reference value $N_T$, the digital output signal $N_{OUT}$ has a value of 0.

For example, the RF transceiver 200 includes the auto amplitude calibration controller 281 and the auto frequency calibration controller 282 disposed in the RF transceiver IC and thereby, the first oscillator 210 may operate stably. The auto amplitude calibration controller 281 is electrically connected to the first oscillator 210, and performs a function of automatically correcting an amplitude of the first oscillator 210. The auto frequency calibration controller 282 is electrically connected to the first oscillator 210, and performs a function of automatically correcting a frequency of the first oscillator 210.

All elements of the RF transceiver 200, excluding an antenna, may be disposed in the RF transceiver IC such that it is possible to use fewer external components of a relatively large volume or a relatively large size. Thus, the RF transceiver 200 may be advantageously miniaturized in comparison to related technology that uses a great number of external components. Also, the RF transceiver 200 provides the advantage that a low frequency noise and a DC offset occurring in an amplifier disposed between the first oscillator 210 and the counter 250 may be easily removed by the AC coupling capacitor 240.

Figure 3:
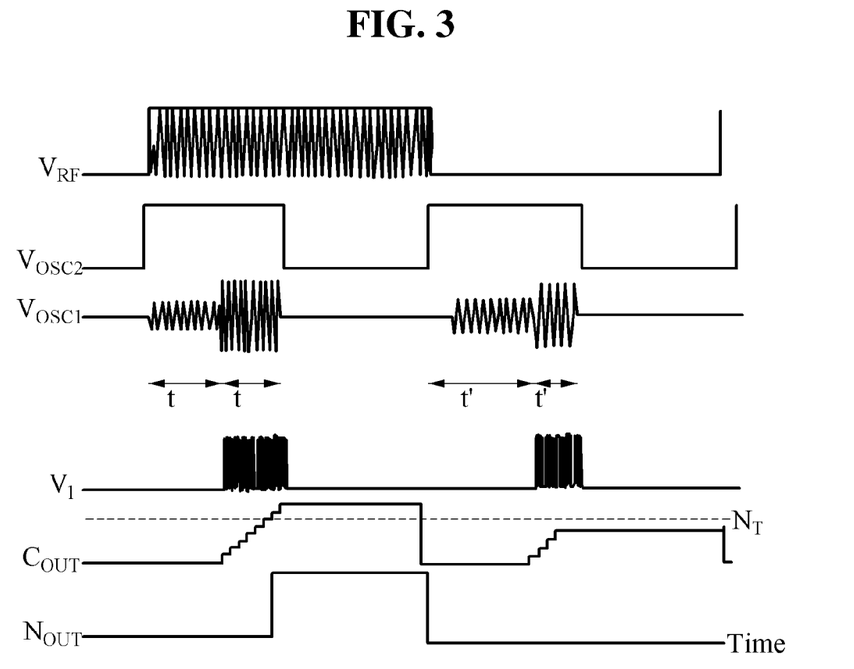
FIG. 3 is a timing diagram illustrating a signal of a radio frequency (RF) transceiver, according to an embodiment.

FIG. 3 is a timing diagram illustrating a signal of the radio frequency (RF) transceiver 200 of FIG. 2, according to an embodiment. FIG. 3 illustrates examples in which each signal is changed as time elapses during a receiving operation of the RF transceiver 200. A counter output $N_{OUT1}$, (e.g., the output of the counter 250 in FIG. 2) when an RF signal $V_{RF}$ corresponds to 1 and a counter output $N_{OUT0}$ (e.g., the output of the counter 250 in FIG. 2) when the RF signal $V_{RF}$ corresponds to 0 may be expressed as shown below in Equations 1 and 2.

$$N_{OUT1} = \frac{Tosc2 - 2t1}{2Tosc1} = \frac{t2}{2Tosc1} \quad \text{[Equation 1]}$$

$$N_{OUT0} = \frac{Tosc2 - 2t'1}{2Tosc1} = \frac{t'2}{2Tosc1} \quad \text{[Equation 2]}$$

In Equations 1 and 2, $T_{OSC1}$ is an oscillation period of a first oscillator (e.g., the first oscillator 210 in FIG. 2), and $T_{OSC2}$ is an oscillation period of a second oscillator (e.g., the second oscillator 220 in FIG. 2). When a difference between the counter output $N_{OUT1}$ and the counter output $N_{OUT0}$ corresponds to $\Delta N$, the difference $\Delta N$ may be expressed as shown below in Equation 3.

$$\Delta N = \frac{(D1 - D2)fosc1}{2fosc2} \quad \text{[Equation 3]}$$

In Equation 3, D1 is a ratio of the oscillation period of the second oscillator 220 to a duration time during which the first oscillator 210 oscillates when the RF signal $V_{RF}$ corresponds to 1, and D2 is a ratio of the oscillation period of the second oscillator 220 to the duration time during which the first oscillator 210 oscillates when the RF signal $V_{RF}$ corresponds to 0. D1 and D2 may be expressed as shown below in Equation 4.

$$D1 = \frac{t2}{Tosc2}, D2 = \frac{t'2}{Tosc2} \quad \text{[Equation 4]}$$

As shown in above Equations 1, 2, 3, and 4, and FIG. 3, a method that causes a difference of output values of the counter 250 may be used, because a length of the oscillation period of the first oscillator 210 when the RF signal $V_{RF}$ corresponds to 1 is different from a length of the oscillation period of the first oscillator 210 when the RF signal $V_{RF}$ corresponds to 0.

When the RF signal $V_{RF}$ corresponds to 1, the oscillation of the first oscillator 210 may be relatively fast, such that a length t'2 of the oscillation period may be relatively great. Thus, a number of clocks to be counted by the counter 250 may be a relatively great value.

When the RF signal $V_{RF}$ corresponds to 0, the oscillation of the first oscillator 210 may be relatively slow such that a length t'2 of the oscillation period may be relatively small. Thus, the number of clocks to be counted by the counter 250 may be a relatively small value.

In response to the output value of the counter output signal $C_{OUT}$ being greater than or equal to the reference value $N_T$, the digital output signal $N_{OUT}$ may have a value of 1. In response to the output value of the counter output signal $C_{OUT}$ being less than the reference value $N_T$, the digital output signal $N_{OUT}$ may have a value of 0.

Figure 4:
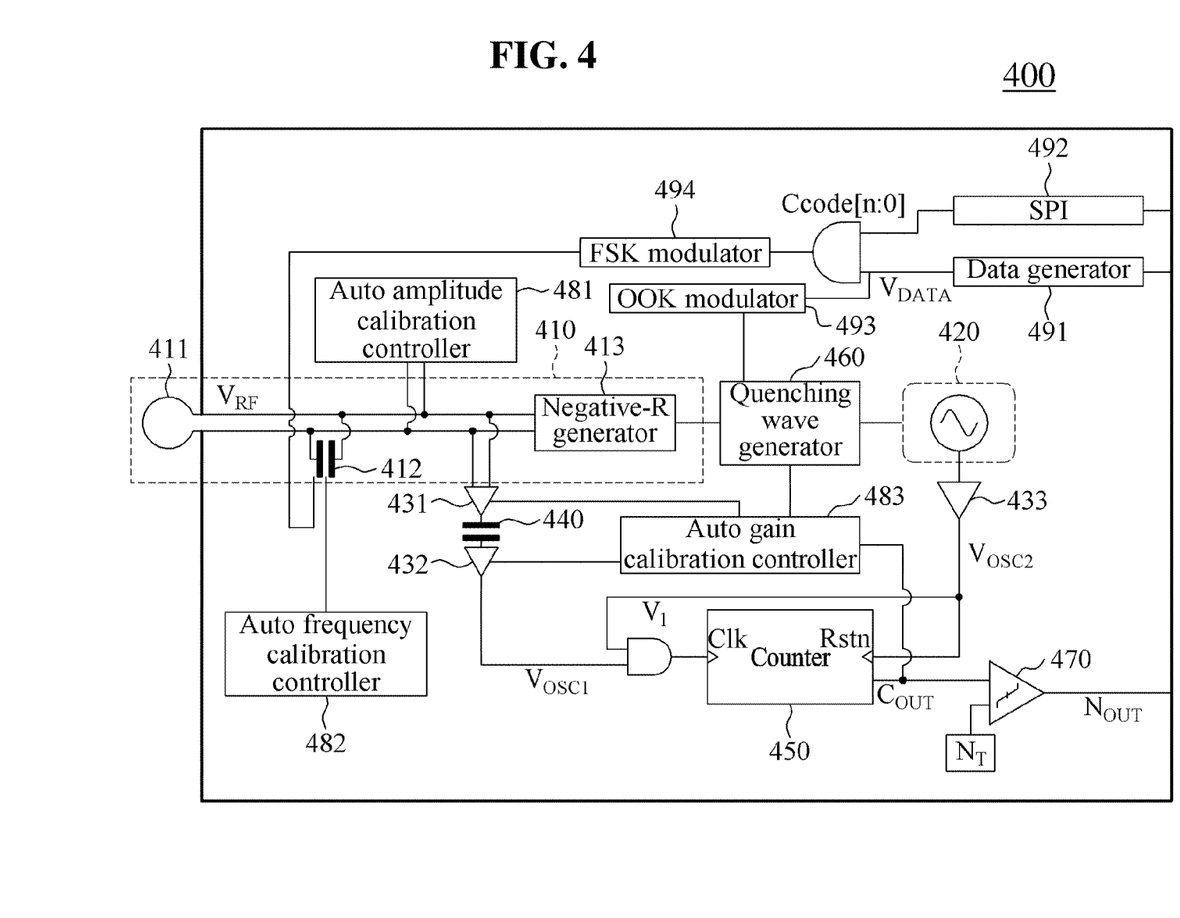
FIG. 4 is a block diagram illustrating a portion of a radio frequency (RF) transceiver, according to another embodiment.

FIG. 4 is a block diagram illustrating a portion of a radio frequency (RF) transceiver 400, according to another embodiment. In an example, the RF transceiver 400 includes a first oscillator 410, a second oscillator 420, a counter 450, and a comparer 470. The RF transceiver 400 also includes a data generator 491, a serial peripheral interface (SPI) 492, an on-off keying (OOK) modulator 493, and a frequency-shift keying (FSK) modulator 494. The RF transceiver 400 further includes amplifiers 431, 432, and 433, an alternating current (AC) coupling capacitor 440, a quenching wave generator 460, an auto amplitude calibration controller 481, an auto frequency calibration controller 482, and an auto gain calibration controller 483. For example, the first oscillator 410 includes an antenna 411, a capacitor bank (C-bank) 412, and a negative-R generator 413. The C-bank 412 is connected in parallel with the antenna 411 and the negative-R generator 413. The RF transceiver 400 has a configuration to be used to transmit through an RF port used for receiving an RF signal. For example, the data generator 491 generates a data signal $V_{DATA}$. The generated data signal $V_{DATA}$ may be modulated by the OOK modulator 493 that controls an output power of an oscillator or the FSK modulator 494 that uses two oscillation frequencies f1 and f2 used to differentiate between 0 and 1.

Because the antenna 411 is directly connected to the first oscillator 410, an output of the first oscillator 410 is transmitted to an outside source through the antenna 411 even when the modulated data signal $V_{DATA}$ is transmitted. A oscillation frequency of the first oscillator 410 may be adjusted using Ccode[n:o].

Repeated descriptions will be omitted for increased clarity and conciseness because the descriptions provided with reference to FIG. 2 are also applicable to FIG. 4.

Figure 5:
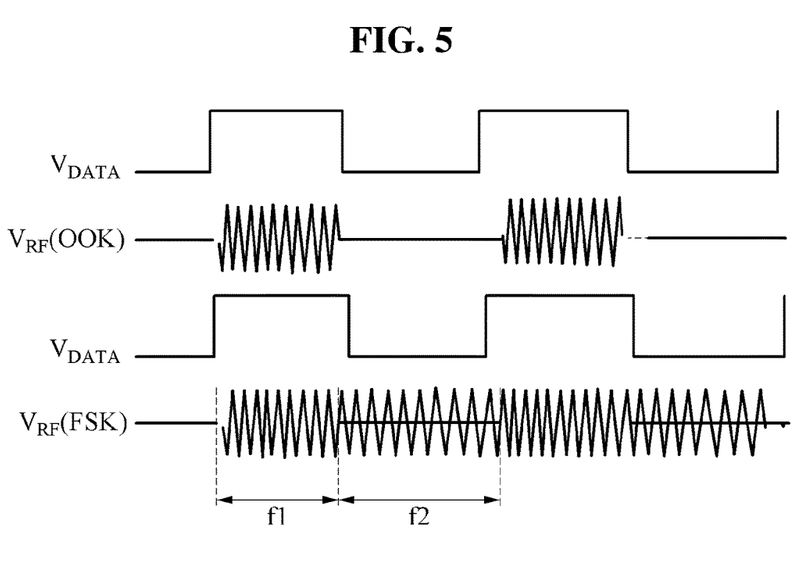
FIG. 5 is a timing diagram illustrating a signal of a radio frequency (RF) signal, according to another embodiment.

FIG. 5 is a timing diagram illustrating a signal of a radio frequency (RF) signal, according to another embodiment. FIG. 5 illustrates examples in which each signal is changed as time elapses during a transmitting operation of the RF transceiver 400 of FIG. 4.

Referring to FIG. 5, $V_{RF}$ (OOK) indicates an RF signal that is modulated based on an on-off keying (OOK) method. In the OOK method, an output of an oscillator (e.g., the first oscillator 410) indicates an on state when a data signal $V_{DATA}$ corresponds to 1, and the output of the first oscillator 410 indicates an off state when the data signal $V_{DATA}$ corresponds to 0 and thus, the RF signal is modulated.

$V_{RF}$ (FSK) indicates an RF signal that is modulated using a first oscillation frequency f1 and a second oscillation frequency f2 based on a frequency-shift keying (FSK) method. In the FSK method, the output of the first oscillator 410 indicates the first oscillation frequency f1 when the data signal $V_{DATA}$ corresponds to 1 and the output of the first oscillator 410 indicates the second oscillation frequency f2 when the data signal $V_{DATA}$ corresponds to 0 and thus, the RF signal is modulated.

Figure 6:
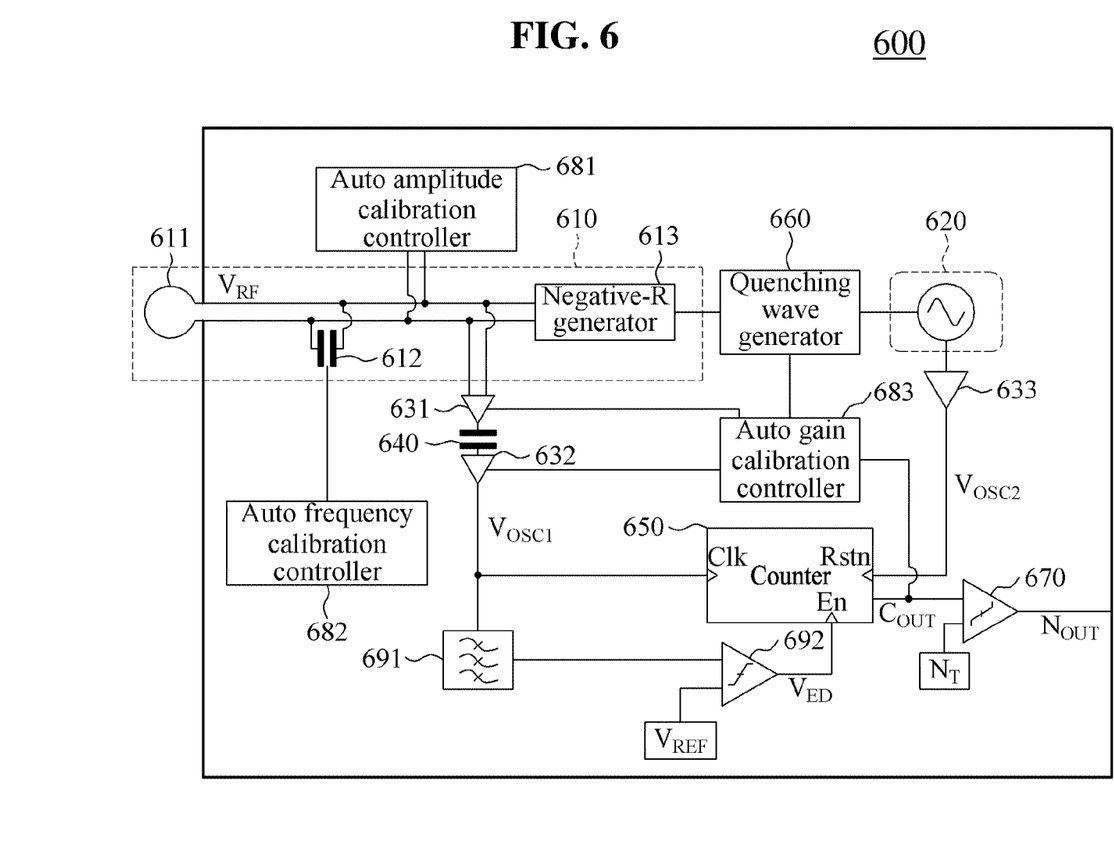
FIG. 6 is a block diagram illustrating a portion of a radio frequency (RF) transceiver, according to another embodiment.

FIG. 6 is a block diagram illustrating a portion of a radio frequency (RF) transceiver 600, according to another embodiment. The RF transceiver 600 includes a first oscillator 610, a second oscillator 620, a counter 650, and a comparer 670. The RF transceiver 600 also includes a filter 691 and a comparer 692. The RF transceiver 600 further includes amplifiers 631, 632, and 633, an alternating current (AC) coupling capacitor 640, a quenching wave generator 660, an auto amplitude calibration controller 681, an auto frequency calibration controller 682, and an auto gain calibration controller 683. In an example, the first oscillator 610 includes an antenna 611, a capacitor bank (C-bank) 612, and a negative-R generator 613. The C-bank 612 is connected in parallel with the antenna 611 and the negative-R generator 613.

The RF transceiver 600 has a configuration for applying, to an enable signal En of the counter 650, an envelope signal $V_{ED}$ detected using an envelope detector configured to detect a predetermined level $V_{REF}$ corresponding to a reference value.

Repeated descriptions will be omitted for increased clarity and conciseness because the descriptions provided with reference to FIG. 2 are also applicable to FIG. 6.

Figure 7:
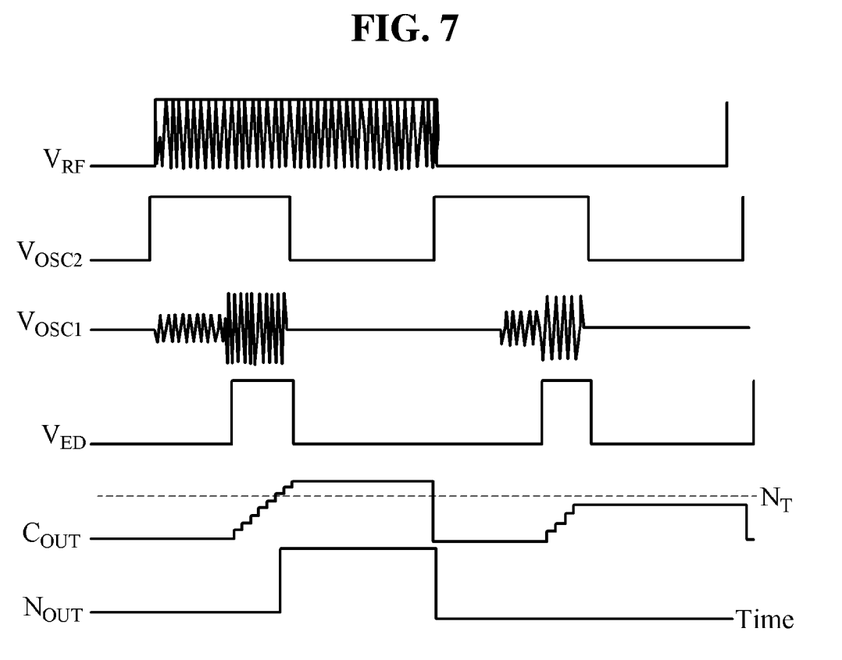
FIG. 7 is a timing diagram illustrating a signal of a radio frequency (RF) transceiver, according to another embodiment.

FIG. 7 is a timing diagram illustrating a signal of the radio frequency (RF) transceiver 600 of FIG. 6, according to an embodiment. FIG. 7 illustrates examples in which each signal is changed as time elapses during a receiving operation of the RF transceiver 600. As illustrated in FIG. 7, an envelope signal $V_{ED}$ detected using an envelope detector is applied to an enable signal En of a counter.

When an RF signal $V_{RF}$ corresponds to 1, oscillation of the first oscillator 610 may be relatively fast such that a length t'2 of an oscillation period may be relatively great. Thus, a number of clocks to be counted by the counter may be a relatively great value.

When the RF signal $V_{RF}$ corresponds to 0, the oscillation of the first oscillator 610 may be relatively slow such that a length t'2 of the oscillation period may be relatively small. Thus, the number of clocks to be counted by the counter may be a relatively small value.

In response to an output value of a counter output signal $C_{OUT}$ being greater than or equal to the reference value $N_T$, the digital output signal $N_{OUT}$ may have a value of 1. In response to the output value of the counter output signal $C_{OUT}$ being less than the reference value $N_T$, the digital output signal $N_{OUT}$ may have a value of 0.

Figure 8:
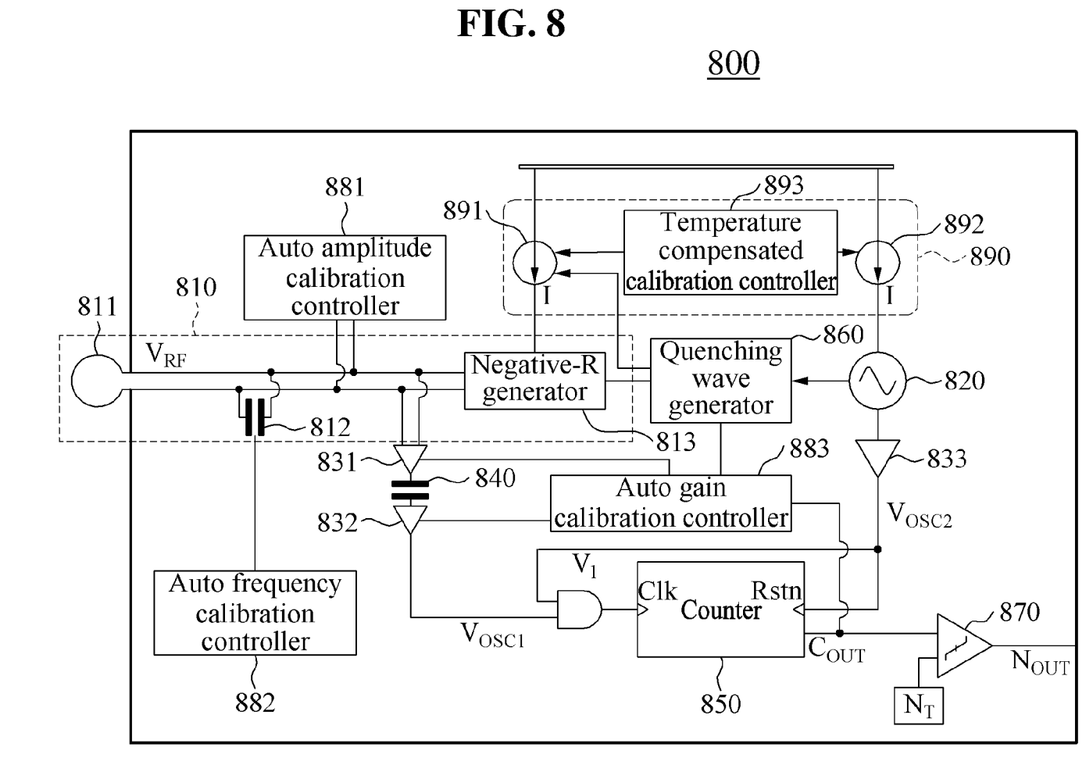
FIG. 8 is a block diagram illustrating a portion of a radio frequency (RF) transceiver, according to another embodiment.

FIG. 8 is a block diagram illustrating a portion of a radio frequency (RF) transceiver 800, according to another embodiment. The RF transceiver 800 includes a first oscillator 810, a second oscillator 820, a counter 850, a comparer 870, and a temperature compensated current source 890. The temperature compensated current source 890 includes a first current source 891, a second current source 892, and a temperature compensated calibration controller 893. The RF transceiver 800 further includes amplifiers 831, 832, and 833, an alternating current (AC) coupling capacitor 840, a quenching wave generator 860, an auto amplitude calibration controller 881, an auto frequency calibration controller 882, and an auto gain calibration controller 883. In an example, the first oscillator 810 includes an antenna 811, a capacitor bank (C-bank) 812, and a negative-R generator 813. The C-bank 812 is connected in parallel with the antenna 811 and the negative-R generator 813.

The first current source 891 supplies a current to the first oscillator 810, and the second current source 892 supplies the current to the second oscillator 820. In response to change rates of oscillation frequencies differing based on a temperature of each of the first oscillator 810 and the second oscillator 820, the temperature compensated calibration controller 893 controls the first current source 891 and the second current source 892 in order to compensate for the differing change rates.

Because a structure of the RF transceiver to be proposed uses a method of calculating an output value of a counter output signal based on a ratio of a frequency of the first oscillator 810 to a frequency of the second oscillator 820, a final output signal $N_{OUT}$ may be insensitive to the change rates based on the temperature. Repeated descriptions will be omitted for increased clarity and conciseness because the descriptions provided with reference to FIG. 2 are also applicable to FIG. 8.

Figure 9:
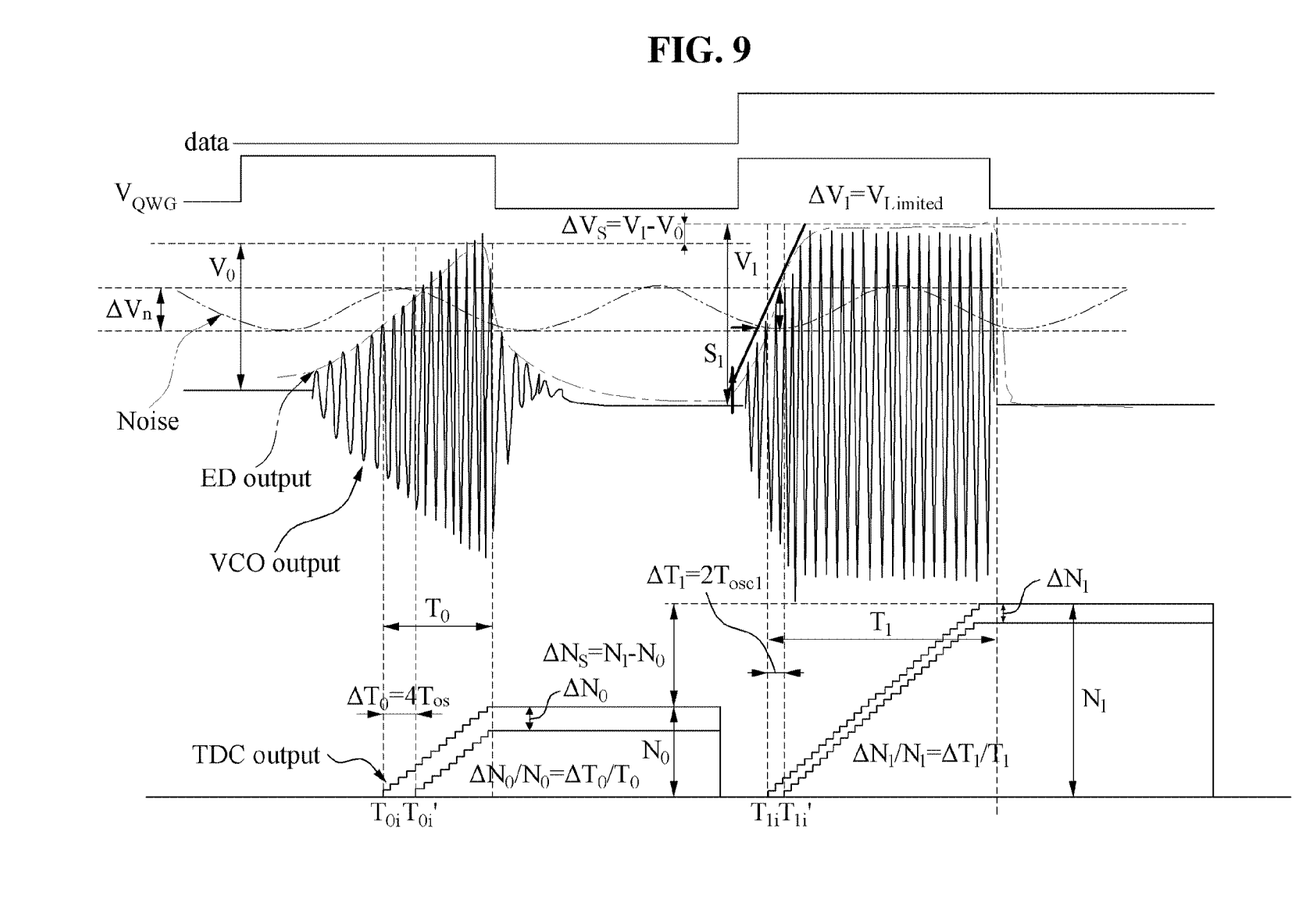
FIG. 9 is a timing diagram illustrating a signal of a radio frequency (RF) transceiver, according to another embodiment.

FIG. 9 is a timing diagram illustrating a signal of the radio frequency (RF) transceiver 800, according to an embodiment. FIG. 9 illustrates a comparison between an envelope detector (ED) method according to a related art and a time to digital converter (TDC) method according to an embodiment. A difference between influences of noises when the ED method and the TDC method are used may be learned by referring to FIG. 9.

When the ED method is used, a signal may be distinguished only when a difference $\Delta V_s$ between a power $V_0$ of an output signal in response to a data signal data corresponding to 0 and a power $V_1$ of the output signal in response to the data signal data corresponding to 1 is greater than a noise $\Delta V_n$ to be applied. It may be preferable that an output of a signal is relatively great, but the output of the signal may be limited by a supply voltage $V_{Limited}$. Thus, accuracy of a receiving signal deteriorating due to noises may be unavoidable because a power of the signal is limited.

However, when the TDC method is used, a value of $N_1$ is increased such that a difference $\Delta N_S$ between a power $N_0$ of an output signal in a case in which the data signal data corresponds to 0 and a power $N_1$ of the output signal in a case in which the data signal data corresponds to 1 is increased. Also, because a degree of time difference is measured in a time domain, the difference $\Delta Ns$ is increased when $T_{osc1}$ is decreased. That is, an oscillation frequency $f_{osc1}$ is relatively fast, and an oscillation speed of a quench wave generator is reduced. A duty cycle of a signal is increased in the quench wave generator such that a length of a period of $T_1$ is increased.

The difference $\Delta Ns$ is increased when a slope S1 based on a settling time is increased, and the slope S1 may be increased when a high Q(LC) is used. In addition, a length of a period of $\Delta N_0$ or a length of a period of $\Delta N_1$ that is changed due to a noise based on a slope may be also decreased.

The components in FIG. 1 (e.g., the auto amplitude calibration controller, the clock generator, the frequency synthesizer, the course/fine calibration controller, the quenching wave generator, and the coarse frequency calibration controller), the components in FIG. 2 (e.g., the first oscillator 210, the negative-R generator 213, the second oscillator 220, the counter 250, the quenching wave generator 260, the comparer 270, the auto amplitude calibration controller 281, the auto frequency calibration controller 282, the auto gain calibration controller 283, and the temperature compensated current source 290), the components in FIG. 4 (e.g., the first oscillator 410, the negative-R generator 413, the second oscillator 420, the counter 450, the quenching wave generator 460, the comparer 470, the auto amplitude calibration controller 481, the auto frequency calibration controller 482, the auto gain calibration controller 483, the data generator 491, the SPI 492, the OOK modulator 493, and the FSK modulator 494), the components of FIG. 6 (e.g., the first oscillator 610, the negative-R generator 613, the second oscillator 620, the counter 650, the quenching wave generator 660, the comparer 670, the auto amplitude calibration controller 681, the auto frequency calibration controller 682, the auto gain calibration controller 683, the filter 691 and the comparer 692), and the components of FIG. 8 (e.g., the first oscillator 810, the negative-R generator 813, the second oscillator 820, the counter 850, the quenching wave generator 860, the comparer 870, the auto amplitude calibration controller 881, the auto frequency calibration controller 882, the auto gain calibration controller 883, the current sources 891 and 892, and the temperature compensated calibration controller 893) that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency (RF) transceiver comprising:
   a first oscillator configured to generate a first oscillation frequency associated with an RF signal;
   a second oscillator configured to generate a second oscillation frequency associated with a clock frequency;
   a quenching wave generator configured to generate a quenching signal that controls a negative-R generator of the first oscillator using the second oscillation frequency;
   a counter configured to generate a counter output signal using the first oscillation frequency and the second oscillation frequency; and
   a comparer configured to generate a digital output signal associated with the RF signal by comparing an output value of the counter output signal to a reference value.

2. The RF transceiver of claim 1, wherein the counter output signal is associated with a ratio of the first oscillation frequency to the second oscillation frequency.

3. The RF transceiver of claim 1, wherein the first oscillator comprises:
   an antenna configured to receive the RF signal;
   the negative-R generator being electrically connected to the antenna; and
   a capacitor bank connected in parallel with the antenna and the negative-R generator.

4. The RF transceiver of claim 1, further comprising:
   an auto gain calibration controller configured to disable the quenching wave generator and the negative-R generator in response to an input power of the RF signal being greater than or equal to a threshold value.

5. The RF transceiver of claim 1, further comprising:
   an alternating current (AC) coupling capacitor disposed between the first oscillator and the counter.

6. The RF transceiver of claim 1, further comprising:
   a data generator configured to generate transmission data; and
   a modulator configured to modulate the transmission data received from the data generator using the first oscillator.

7. The RF transceiver of claim 1, further comprising:
   an auto amplitude calibration controller connected to the first oscillator and configured to correct an amplitude of the first oscillator.

8. The RF transceiver of claim 1, further comprising:
   an auto frequency calibration controller electrically connected to the first oscillator and configured to correct a frequency of the first oscillator.

9. The RF transceiver of claim 1, wherein the first oscillator and the second oscillator are disposed in a single RF transceiver integrated circuit (IC).

10. A radio frequency (RF) transceiver comprising:
    a first oscillator configured to generate a first oscillation frequency associated with an RF signal;
    a second oscillator configured to generate a second oscillation frequency associated with a clock frequency;
    a quenching wave generator configured to generate a quenching signal that controls a negative-R generator of the first oscillator using the second oscillation frequency;
    an envelope detector configured to detect an envelope signal from the first oscillation frequency;
    a counter configured to generate a counter output signal using the first oscillation frequency, the second oscillation frequency, and the envelope signal; and
    a comparer configured to generate a digital output signal associated with the RF signal by comparing the counter output signal to a reference value.

11. The RF transceiver of claim 10, wherein the counter output signal is associated with a ratio of the first oscillation frequency to the second oscillation frequency.

12. The RF transceiver of claim 10, wherein the envelope signal is applied to an enable signal of the counter.

13. The RF transceiver of claim 10, wherein the first oscillator comprises:
    an antenna configured to receive the RF signal;
    the negative-R generator being electrically connected to the antenna; and
    a capacitor bank connected in parallel with the antenna and the negative-R generator.

14. The RF transceiver of claim 10, further comprising:
    an auto gain calibration controller configured to disable the quenching wave generator and the negative-R generator in response to an input power of the RF signal being greater than or equal to a threshold value.

15. The RF transceiver of claim 10, further comprising:
    an alternating current (AC) coupling capacitor disposed between the first oscillator and the counter.

16. A radio frequency (RF) transceiver comprising:
    a first oscillator configured to generate a first oscillation frequency associated with an RF signal;
    a second oscillator configured to generate a second oscillation frequency associated with a clock frequency;
    a quenching wave generator configured to generate a quenching signal that controls the first oscillator using the second oscillation frequency; and
    an auto gain calibration controller configured to enable or disable the quenching wave generator based on an input power of the RF signal.

17. The RF transceiver of claim 16, wherein the auto gain calibration controller is further configured to enable the quenching wave generator in response to a receiving sensitivity level being relatively high.

18. The RF transceiver of claim 16, further comprising:
    a counter configured to generate a counter output signal using the first oscillation frequency and the second oscillation frequency; and
    a comparer configured to generate a digital output signal associated with the RF signal by comparing an output value of the counter output signal to a reference value.

* * * * *